United States Patent [19]
Ishio et al.

[11] Patent Number: 6,130,010
[45] Date of Patent: *Oct. 10, 2000

[54] METHOD FOR PRODUCING A SEMICONDUCTOR DYNAMIC SENSOR USING AN ANISOTROPIC ETCHING MASK

[75] Inventors: Seiichiro Ishio, Kariya; Kenichi Ao, Tokai, both of Japan

[73] Assignee: Denso Corporation, Kariya, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/772,993

[22] Filed: Dec. 23, 1996

[30] Foreign Application Priority Data

Dec. 27, 1995 [JP] Japan .................................. 7-341607

[51] Int. Cl.⁷ .................................................. G03F 9/00
[52] U.S. Cl. ................................................................ 430/5
[58] Field of Search ................................ 430/5; 156/345

[56] References Cited

U.S. PATENT DOCUMENTS

| | | | |
|---|---|---|---|
| 3,765,969 | 10/1973 | Kragness et al. | 156/17 |
| 4,923,772 | 5/1990 | Kirch et al. | 430/5 |
| 5,525,549 | 6/1996 | Fukada et al. | 437/227 |
| 5,707,765 | 1/1998 | Chen | 430/5 |

FOREIGN PATENT DOCUMENTS

| | | | |
|---|---|---|---|
| 5-264572 | 10/1993 | Japan | G01P 15/12 |
| 6-163511 | 6/1994 | Japan | H01L 21/306 |
| 94-163511 | 6/1994 | Japan | H01L 21/306 |

OTHER PUBLICATIONS

English translation of JP 6–163511, Jun. 1994.
Cobb et al. "Fast, Low–Complexity Mask Design", SPIE vol. 2440, 313–327, Mar. 1995.
Starikov, "Use of a Single Size Square Serif for Variable Print Bias Compensation in Microlithography: Method, Design, and Practice.", SPIE vol. 1088, 34–46, Mar. 1989.
Buck et al., "A Comparison of Wet and Dry Chrome Etching with the CORE–2564", 42–49, Dec. 31, 1994.
Shimanoe et al., "Etching Mask Pattern and Manufacturing Method for an Intricate Device Using This Etching Mask Pattern", English translation, Jun. 10, 1994.
"Si Micro Machining Advanced Studies," Published by Science Forum on Mar. 31, 1992, P117–118.

*Primary Examiner*—Nam Nguyen
*Assistant Examiner*—Steven H. Ver Steeg
*Attorney, Agent, or Firm*—Pillsbury Madison & Sutro LLP

[57] ABSTRACT

In a method for producing a semiconductor dynamic sensor, an anisotropic etching mask is formed on a (100) crystal orientation silicon substrate with a main portion and form-compensation portions formed at the corners of the main portion. Each of the form-compensation portions has a rectangular shape with a long side and a short side. Further, one of the long and short sides of the etching mask stretches in the [011] direction of the silicon substrate, and the other side stretches in the [0$\bar{1}$1] direction of the silicon substrate. As a result, the silicon substrate can be etched into a predetermined shape without making large corner-undercut portions on a non-etched portion corresponding to the main portion of the mask.

39 Claims, 15 Drawing Sheets

(100) SURFACE

MASKED PORTION

METHOD FOR PRODUCING A SEMICONDUCTOR DYNAMIC SENSOR USING AN ANISOTROPIC ETCHING MASK

CROSS-REFERENCE TO RELATED APPLICATION

This application is based upon and claims the benefit of priority of the prior Japanese Patent Application No. 7-341607 filed on Dec. 27, 1995, the content of which is incorporated herein by reference.

BACKGROUND OF THE INVENTION

1. Filed of the Invention

The present invention relates to an anisotropic etching mask used in a method for producing a semiconductor dynamic sensor for detecting an amount of acceleration, pressure or the like.

2. Related Arts

Semiconductor acceleration sensors, one of which is proposed in JP-A-6-104244, are conventionally used in an air bag system, an ABS system and the like of vehicles. FIG. 30 shows a conventional semiconductor acceleration sensor as an example. The acceleration sensor is composed of a silicon substrate 60, a weight 61 formed at the center of the silicon substrate 60, a rectangular frame 62 formed at the periphery of the silicon substrate 60, and thin beams 63, 64, 65, and 66 connecting the weight 61 to the frame 62. The beams 63, 64, 65, 66 have strain gauges 67, 68, 69 and 70 formed thereon respectively. When acceleration is applied to the acceleration sensor in a direction indicated by an arrow Z in FIG. 30, the weight 61 is displaced, resulting in strain stress of the beams 63, 64, 65, and 66. The strain gauges 67, 68, 69, and 70, detect the strain stress and output as an electric signal respectively.

In manufacturing processes for producing the acceleration sensor, the silicon substrate 60 is etched to form grooves 71 and the thin beams 63, 64, 65, and 66 by an anisotropic etching method using a potassium hydroxide (KOH) based etching solution or the like. When, the anisotropic etching method is performed on the silicon substrate 60, predetermined areas of the silicon substrate 60 are covered by a silicon nitride film or the like functioning as an etching mask. Under the silicon nitride film, however, the silicon substrate 60 is undesirably etched, and the corners are rounded off with sloped side walls. Accordingly, various malfunctions of the acceleration sensor are caused. Thus formed rounded corners are hereinafter called as corner-undercut portions.

To solve the problem, an anisotropic etching technique is proposed in "Si micro-machining advanced studies", PP. 117–118, published by Science forum Co. Ltd. in 1992. As shown in FIG. 31, this etching technique employs an etching mask having a rectangular pattern 72 with square form-compensation portions 73 as corner-undercut compensation patterns at the corners of the rectangular pattern 72.

This etching mask is effective in the case that a space between the weight 61 and the frame 62 is sufficiently wide as shown in FIG. 30, that is, that a distance L50 between the rectangular pattern 72 for the weight 61 and a frame pattern for the frame 62 is sufficiently wide as shown in FIG. 31. However, as shown in FIG. 32, when the distance L50 is narrow in a small size sensor, large corner-undercut portions 74 are formed under the etching mask as shown in FIG. 33 even if the etching mask has the square form-compensation portions 73.

When the corner-undercut portions are large, a width W between the beams 63 and 64, and between the beams 65 and 66, becomes narrow. Accordingly, the sensor catches the acceleration in a direction other than the direction of the arrow Z, giving rise to deterioration of directivity of the sensor. Further, the weight 61 becomes small, whereby sensitivity of the sensor decreases.

SUMMARY OF THE INVENTION

The present invention has been accomplished in view of the above-mentioned problem and an object of the present invention is to provide a method for producing a semiconductor dynamic sensor with a miniaturized size, and more particularly to provide an anisotropic etching mask capable of minimizing the size of corner-undercut portions of the semiconductor dynamic sensor.

According to the present invention, in a method for producing a semiconductor dynamic sensor, an anisotropic etching mask is formed on a (100) crystal orientation silicon substrate with a main portion and form-compensation portions formed at the corners of the main portion. Each of the form-compensation portion has a rectangular shape with a long side and a short side. Further, one of the long and the short sides of the form-compensation portions stretches in the [011] direction of the silicon substrate, and the other side stretches in the [0$\bar{1}$1] direction of the silicon substrate.

When an anisotropic etching is performed on the silicon substrate with the anisotropic etching mask, the silicon substrate has a thick portion, the shape of which is approximately the same as the main portion of the aetching mask, without having large corner-undercut portions.

Preferably, the thick portion of the silicon substrate has a rectangular shape with a long side and a short side, and the long side of the form-compensation portions is parallel to the long side of the thick portion.

Because each of the form-compensation portions has a rectangular shape, the corner-undercut portions are prevented from becoming large. Therefore, it is possible to make the sensor small.

Other objects and features of the present invention will become more readily apparent from a better understanding of the preferred embodiment described below with reference to the following drawing figures.

DETAILED DESCRIPTION OF THE PREFERRED EMBODIMENT

An embodiment according to the present invention will be described hereinunder with reference to the drawings.

Figure 1:
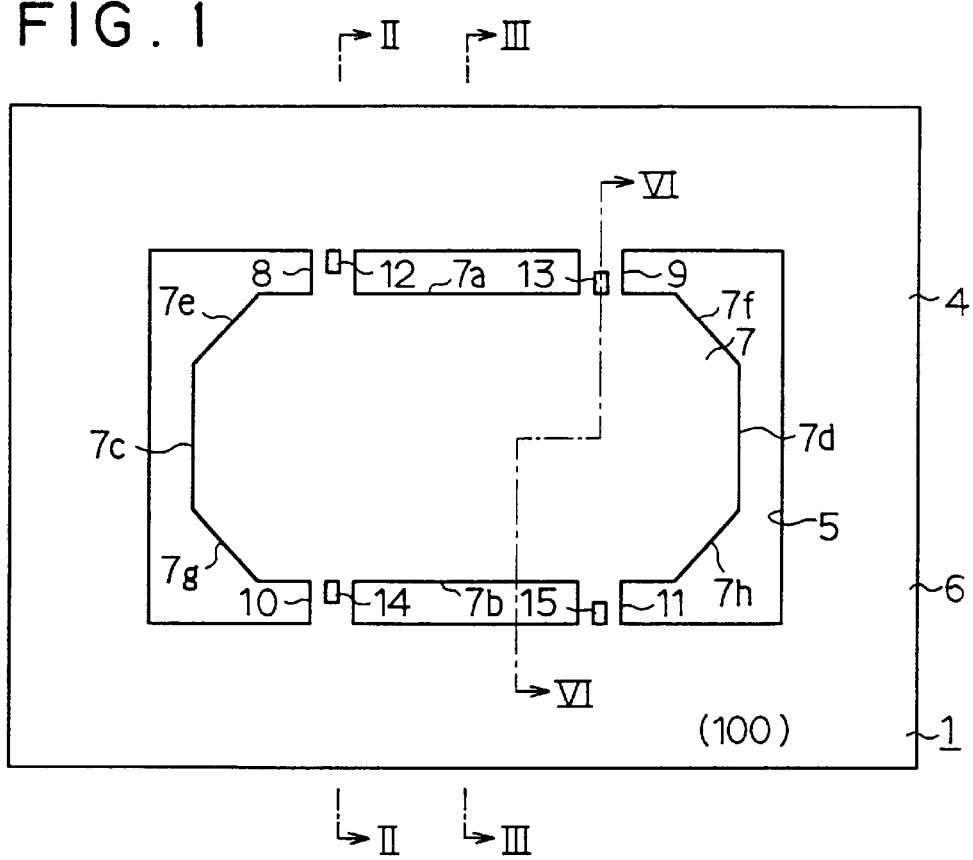
FIG. 1 is a plan view showing a semiconductor acceleration sensor in an embodiment according to the present invention.
Figure 2:
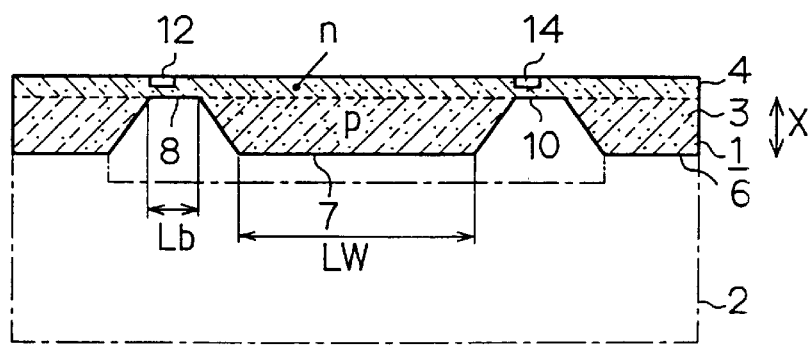
FIG. 2 is a cross-sectional view taken along the II—II line in FIG. 1 showing the acceleration sensor.
Figure 3:
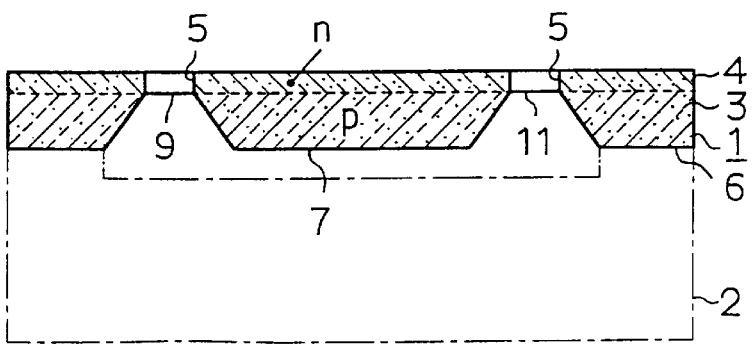
FIG. 3 is a cross-sectional view taken along the III—III line in FIG. 1 showing the acceleration sensor.
Figure 4:
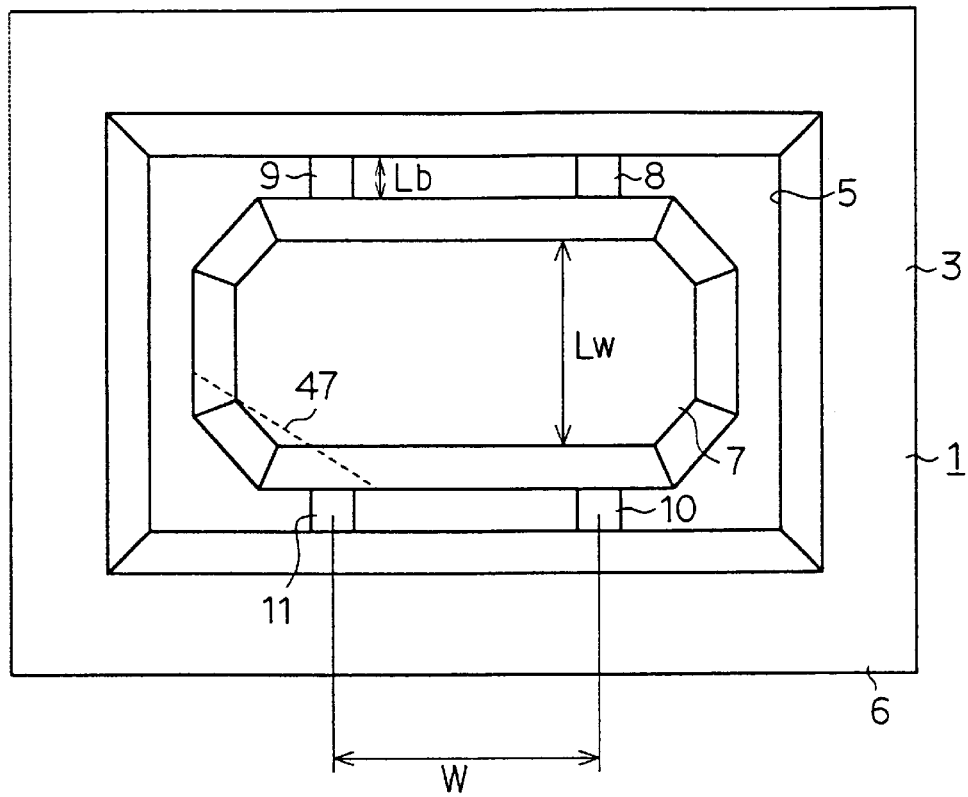
FIG. 4 is a plan view taken from the back side of the acceleration sensor in FIG. 1.

As shown in FIG. 1, a semiconductor acceleration sensor has a rectangular single-crystal silicon substrate (silicon chip) 1 bonded on a glass base 2. FIGS. 2 and 3 show the acceleration sensor taken along the II—II line and the III—III line in FIG. 1 respectively. FIG. 4 shows the acceleration sensor viewed from the back of FIG. 1. In the drawings, "p" designates p-type material and "n" designates n-type material.

The silicon substrate 1 is composed of a p-type silicon substrate 3 and an n-type epitaxial layer 4 deposited on the p-type silicon substrate 3. The silicon substrate 1 has a thick rectangular frame 6, through grooves 5 formed along the inner side of the frame 6, a thick weight 7 formed inside of the through grooves 5, and thin beams 8, 9, 10, and 11 connecting the weight 7 to the frame 6. The silicon substrate 1 is bonded on the glass base 2 through the frame 6.

As shown in FIG. 1, the weight 7 on the front side has a shape generally resembling a rectangle with long sides 7a and 7b, short sides 7c and 7d, and corner sides 7e, 7f, 7g, and 7h formed at the corners of the weight 7. Thin beams 8 and 9 are formed at both ends of the long side 7a, and thin beams 10 and 11 are formed at both ends of the long side 7b.

As shown in FIG. 4, the weight 7 on the back side has an elongated shape with a width $L_w$, and each beam has a length $L_b$.

Each of the beams 8, 9, 10, and 11 is made of the n-type epitaxial layer 4 and has a strain gauge having a p-type impurity diffusion layer. Each value of resistance of the strain gauges changes in response to each amount of strain applied to the beams 8, 9, 10, and 11 respectively.

When acceleration is applied to the substrate 1 in a perpendicular direction with respect to the substrate 1 indicated by an arrow X (a direction X) in FIG. 2, the weight 7 is displaced in the direction X, generating strains in the beams 8, 9, 10, and 11. Accordingly, the values of resistance of the strain gauges change in response to the amounts of strain generated in the beams 8, 9, 10, and 11, so that the amount of acceleration applied to the substrate 1 in the direction X is detected.

Figure 5:
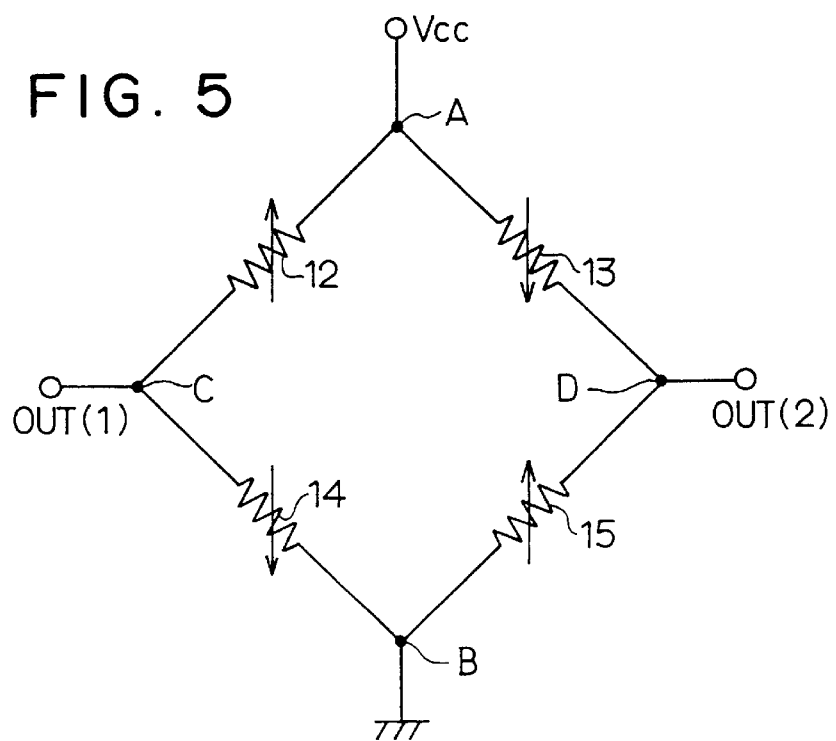
FIG. 5 is a circuit diagram showing an electrical connection of the acceleration sensor.

FIG. 5 shows an electrical connection of the semiconductor acceleration sensor. The strain gauges 12, 13, 14, and 15 form a bridge circuit. A source voltage $V_{cc}$ is applied to a connection point A between the strain gauges 12 and 13. A connection point B between the strain gauges 14 and 15 is grounded, and connection points C and D between the strain gauges 12 and 14, and 13 and 15 function as output terminals. A potential difference between the connection points C and D is output as an electric signal in accordance with the amount of acceleration.

Next, manufacturing processes for producing the semiconductor acceleration sensor employing the above mentioned configuration are explained by referring to FIGS. 6 to 11. FIGS. 6 to 11 are cross-sectional views showing the semiconductor acceleration sensor taken along the VI—VI line in FIG. 1.

First, a (100) crystal orientation p-type silicon wafer 16 is provided on which an n-type epitaxial layer 17 is deposited. The parentheses "( )" are used to denote a specific crystal plane.

Figure 9:
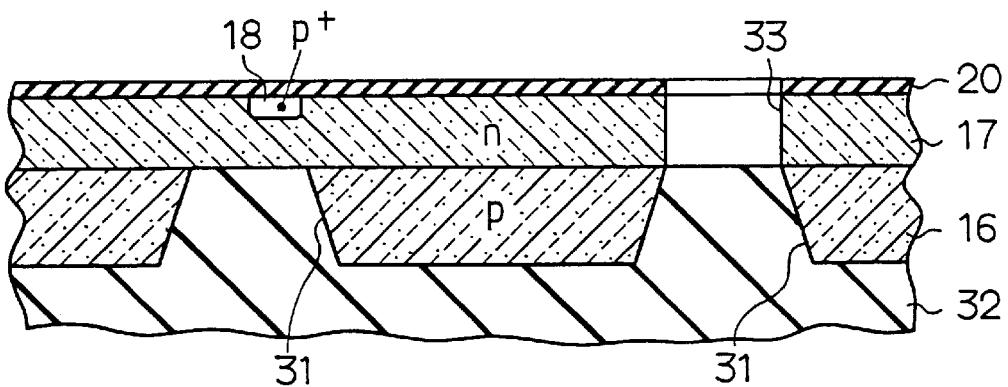

Four $p^+$ diffusion layer regions 18 are formed as piezoresistance areas at predetermined areas of the epitaxial layer 17 on the surface of the epitaxial layer 17. Further, $n^+$ diffusion layer regions 19 which collectively function as an electrode in an electrochemical etching process are formed at predetermined areas of the epitaxial layer 17 on the surface thereof. The $n^+$ diffusion layer regions 19 are eliminated when upper separation grooves 33 (described later) in FIG. 9 are formed.

Thereafter, an oxide layer (not shown) is deposited on the epitaxial layer 17 with openings where the $p^+$ diffusion layer regions 18 have been formed. On the oxide layer, an aluminum wiring layer (not shown) is formed to contact with the $p^+$ diffusion layer regions 18. Thereafter, a passivation layer (not shown) made of silicon oxide or the like is formed with openings which provide contact holes for connecting bonding wires to the $p^+$ diffusion layer regions 18. Aluminum contact portions for supplying electric current in the etching process to the $n^+$ diffusion layer regions 19 are also formed at the same time. Thereafter, a resist film 20 such as a PIQ film is formed with openings at predetermined areas.

Figure 6:
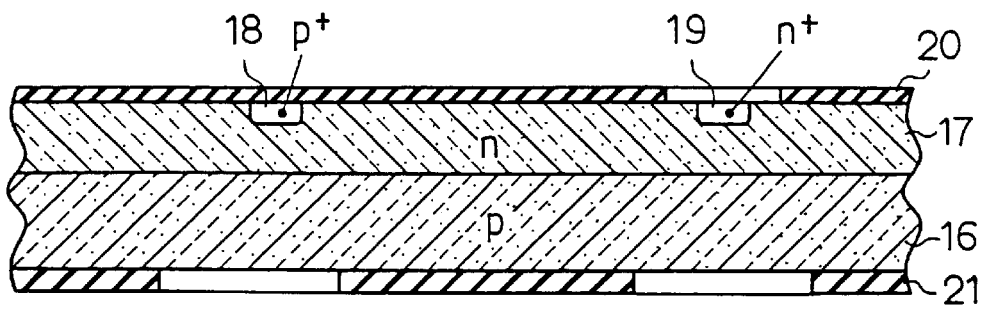
FIGS. 6 through 11 are cross-sectional views of the acceleration sensor for explaining processes for producing the same.

On the opposite surface of the silicon wafer 16 with respect to the epitaxial layer 17, a plasma nitrogen compound layer 21 such as a silicon nitride layer or the like is deposited on the entire area, and then, the plasma nitrogen compound layer 21 is patterned to have a predetermined shape shown in FIG. 6 by employing a photoresist and a mask (photo mask). The process for patterning the plasma nitrogen compound layer 21 is explained in detail by referring to FIGS. 12 and 13.

Figure 13:
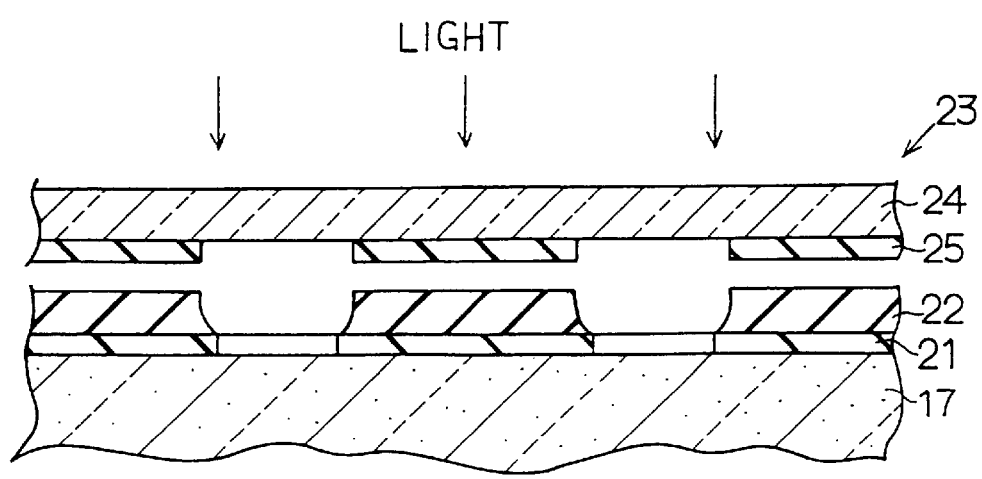
FIG. 13 is a cross-sectional view showing a process for producing the acceleration sensor.
Figure 14:
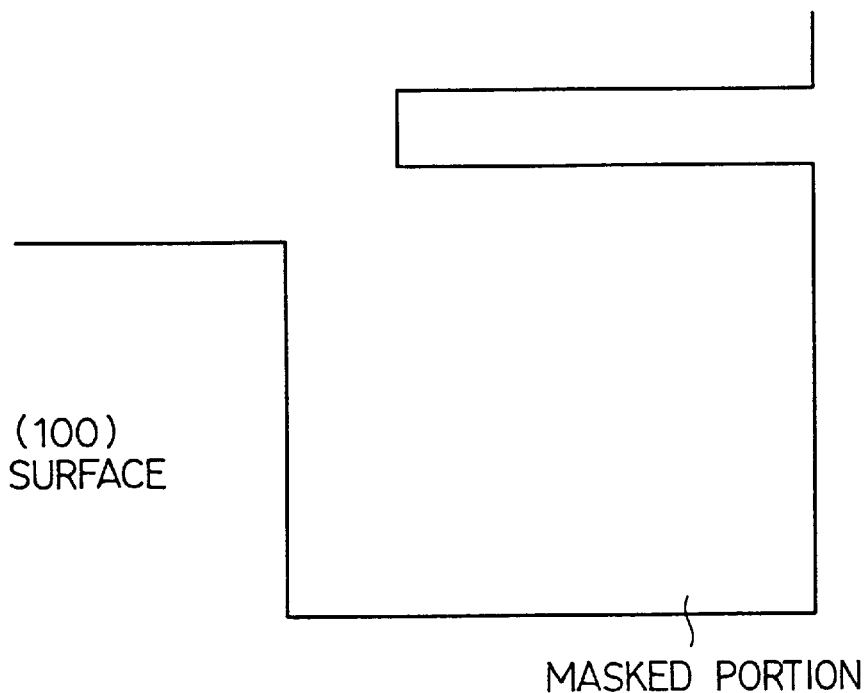
FIG. 14 is a plan view partly showing a state of a silicon wafer under the anisotropic etching mask in an etching process.
Figure 15:
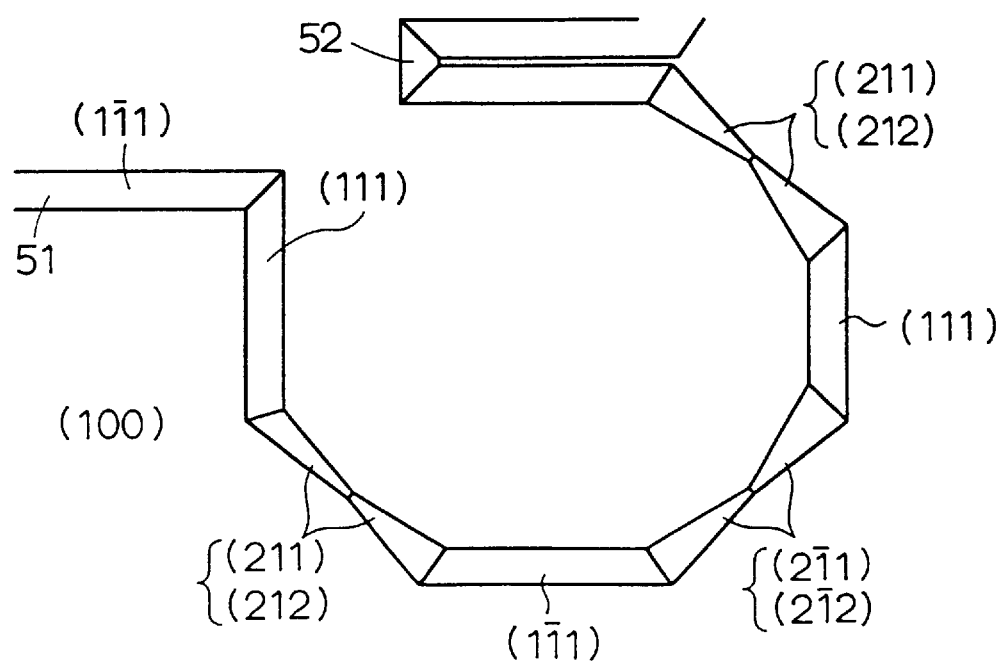
FIG. 15 is a plan view partly showing a state of the silicon wafer under the anisotropic etching mask in the etching process.
Figure 16:
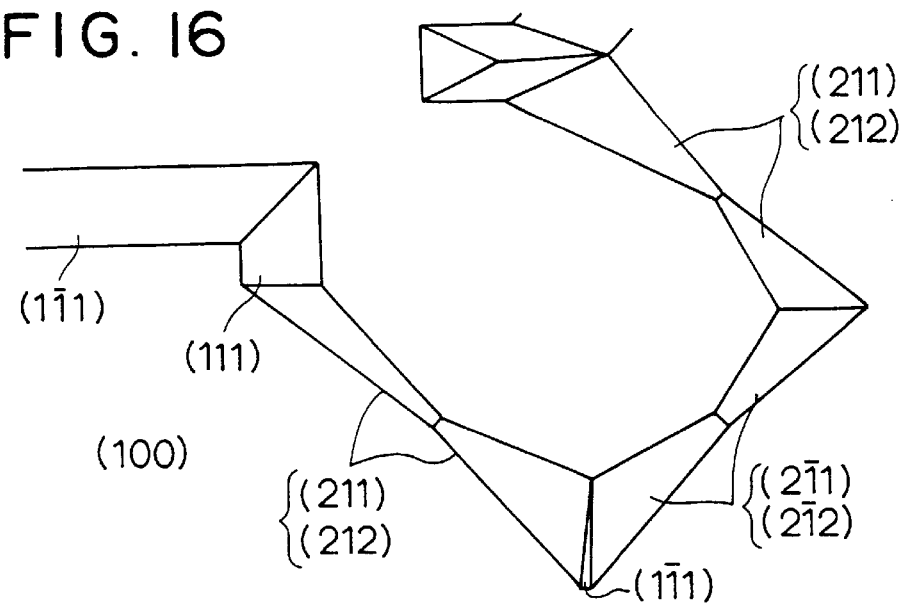
FIGS. 16 through 20 are plan views partly showing states of the silicon wafer under the anisotropic etching mask in the etching process.

As shown in FIG. 13, a photoresist layer 22 is coated on the plasma nitrogen compound layer 21 by a spinning method. Further, a photomask 23 shown in FIG. 13 is provided. The photomask 23 has a glass plate 24 and a chromium thin film 25 deposited on the glass plate 24. The plasma nitrogen compound layer 21 is patterned into the same shape as that of the photomask 23, and functions as an anisotropic etching mask.

Figure 12:
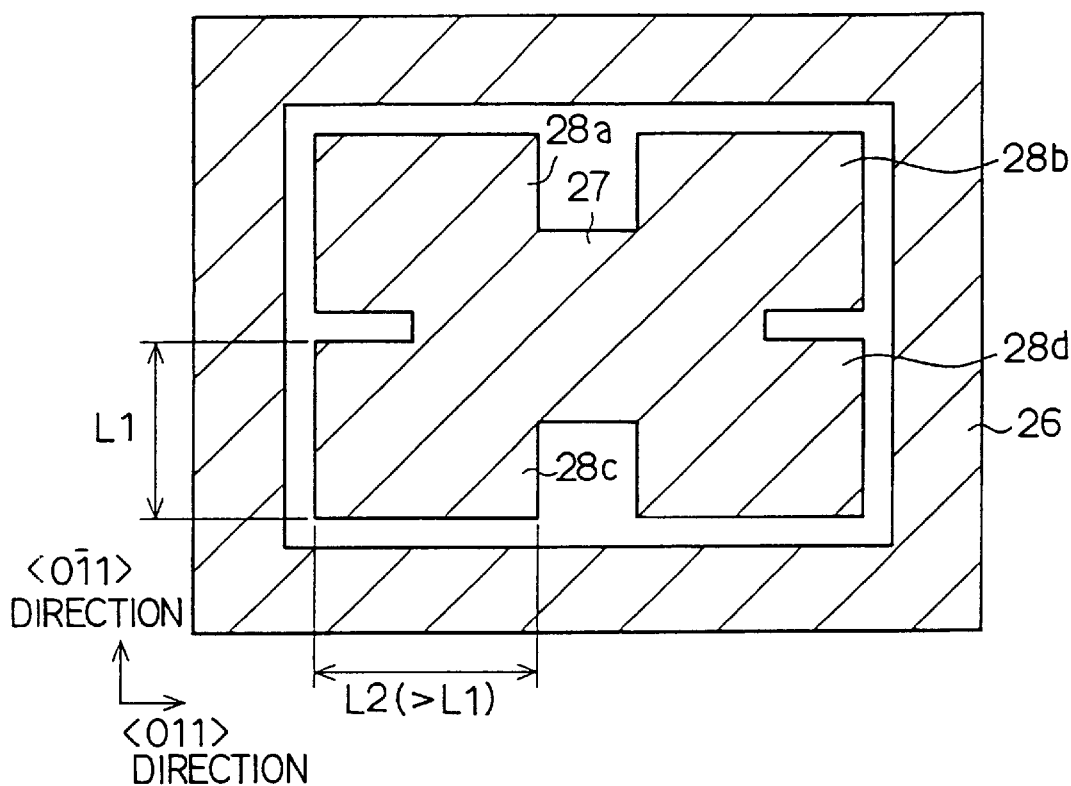
FIG. 12 is a plan view showing an anisotropic etching mask provided in the present invention.

FIG. 12 shows the shape of the photomask, that is, the shape of the anisotropic etching mask. The anisotropic etching mask has a rectangular frame portion 26, a rectangular weight portion 27 (a rectangular pattern) formed inside of the frame portion 26, and form-compensation portions 28a, 28b, 28c, and 28d, each of which is formed at each corner of the weight portion 27 and has a shape generally resembling a rectangle. Each of the form-compensation portions 28a, 28b, 28c and 28d has a short side with a length L1 and a long side with a length L2 which is longer than the length L1. Each short side of the form-compensation portions 28a, 28b, 28c, and 28d stretches in the [0$\bar{1}$1] direction of the silicon wafer 16, and each long side of the form-compensation portions stretches in the [011] direction of the silicon wafer 16. Further, the form-compensation portions are formed so that the direction of the long side thereof corresponds to the elongated direction of the weight portion 27. The brackets "[ ( ) ]" are used to denote a specific direction. For example, the [110] direction denotes a direction perpendicular to the (011) plane.

As shown in FIG. 13, the photoresist layer 22 is patterned after being irradiated with light through the photomask 23 into the same shape as that of the photomask 23. Thereafter, portions of the plasma nitrogen compound layer 21 on which the photoresist layer 22 does not exist are removed. As a result, the plasma nitrogen compound layer 21 is patterned into the same shape as that of the photomask 23.

Figure 7:
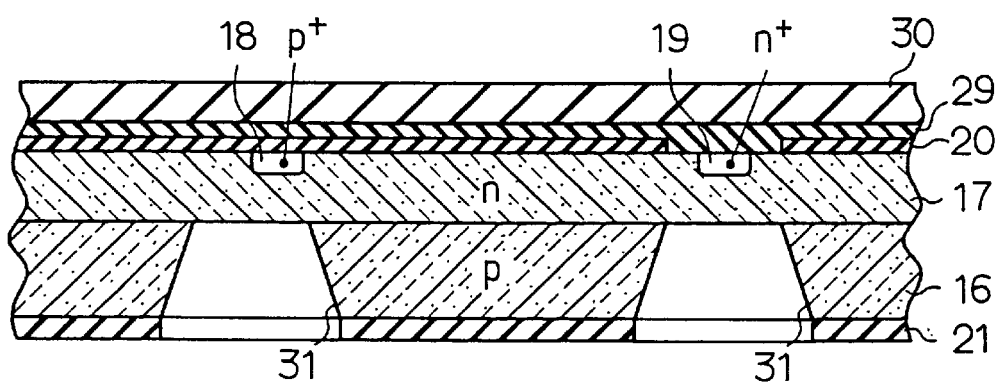

After patterning the plasma nitrogen compound layer 21, as shown in FIG. 7, a supporting plate 30 made of aluminum oxide is attached on the resist film 20 through a wax layer 29 for protecting the epitaxial layer 17. On the supporting plate 30, a platinum electrode is provided to contact to the $n^+$ diffusion layer regions 19 through the aluminum contact portions.

The whole wafer including the silicon wafer 16 and the supporting plate 30 is immersed in an etching solution and an electrochemical etching is performed. An electrical current for etching is supplied from the $n^+$ diffusion layer regions 19 to the p-type silicon wafer 16 through the n-type epitaxial layer 17. The electrochemical etching is stopped at a p-n junction portion formed between the p-type silicon wafer 16 and the n-type epitaxial layer 17. As a result, a lower separation groove 31 is formed. This etching process will be described in detail later.

Next, the plasma nitrogen compound layer 21 is dissolved in hydrofluoric acid, and thereafter the wafer is put on a hot plate with the supporting plate 30 facing to the hot plate. The wax layer 29 softens, and the wafer is separated from the supporting plate 30. Then, the wafer is immersed in an organic solvent to remove the wax layer 29, and then taken out from the solvent.

Figure 8:
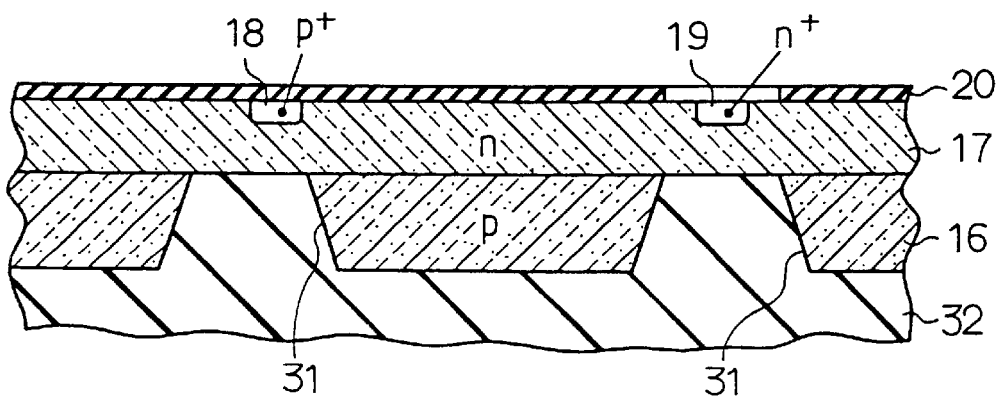

Thereafter, a resist film 32 is coated on the back side of the silicon wafer 16 on the entire area as shown in FIG. 8. Because this resist film 32 is not patterned, it is not necessary to coat the resist film 32 by the spinning method. In this case, resist material flows to coat the silicon wafer 16 and forms the resist film 32.

Figure 10:
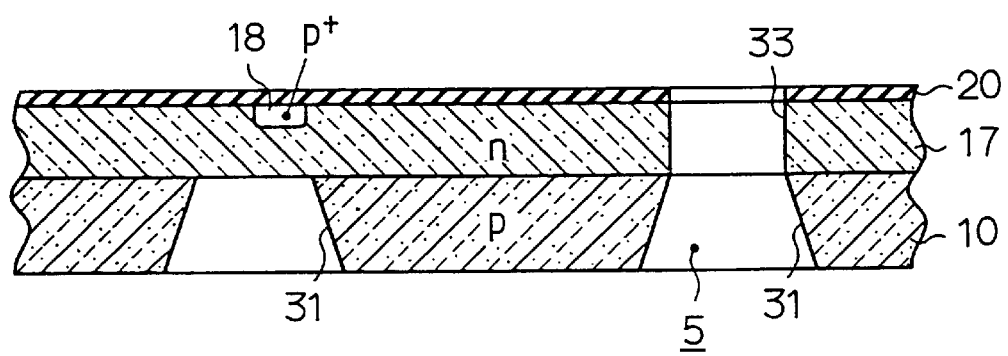
Figure 11:
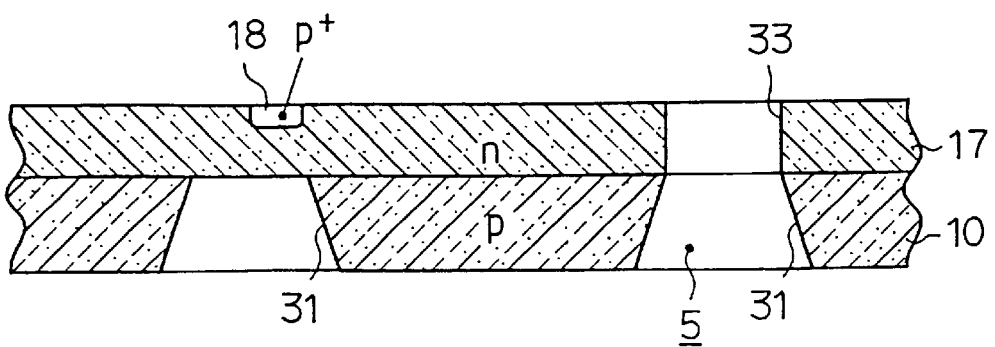

Next, as shown in FIG. 9, the upper separation grooves 33 are formed by a dry etching method through the opening portions of the resist film 20, and thereafter, the resist film 32 is removed in an organic solvent. As a result, the lower separation groove 31 communicates with the upper separation grooves 33, whereby the through grooves 5 shown in FIGS. 1, 4, and 10 are formed.

The resist film 20 is removed by an oxygen plasma ashing method, while a chamber of a plasma asher is maintained at a proper temperature to prevent fluctuation of characteristics of the sensor.

Finally, the wafer is divided into small chips by a dicing process.

Next, the etching process for forming the lower separation groove 31, in which the anisotropic etching mask with the form-compensation portions 28a, 28b, 28c, and 28d is employed, will be described in detail. As the etching process progresses, the silicon wafer under the etching mask changes as shown in FIGS. 14 to 20 in the order.

In the crystal structure of silicon, an etching rate of (100) plane is almost 100 times larger than that of (111) plane, and further, an etching rate of (212) and (211) planes is larger than that of the (100) plane. That is, the (212) and the (211) planes are etched very easily compared with the (111) plane.

Therefore, in the etching process, the (111) and the (1$\bar{1}$1) planes, the etching rate of which is very small, are exposed on sides of silicon wafer portion under the weight portion 27 of the mask, thereby forming sloped walls 51 and 52. Thereafter, because the planes other than the (111) and the (1$\bar{1}$1) planes are not exposed on the sloped walls 51 and 52, the sloped walls 51 and 52 are hardly etched.

Figure 17:
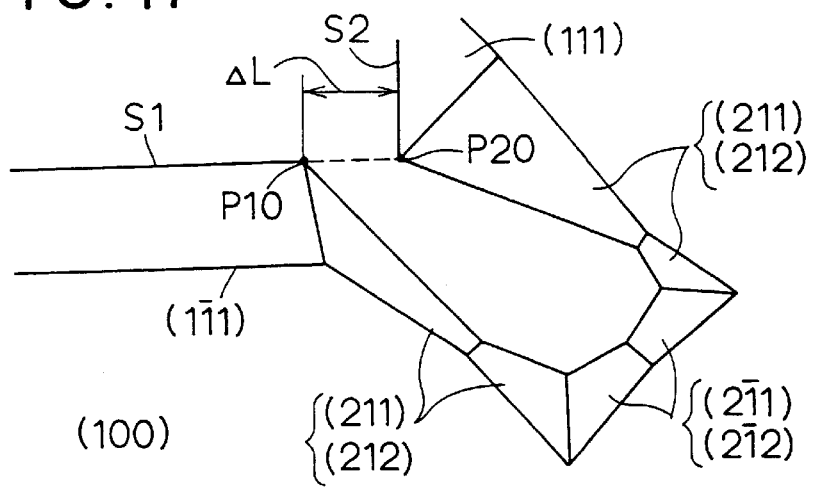
Figure 18:
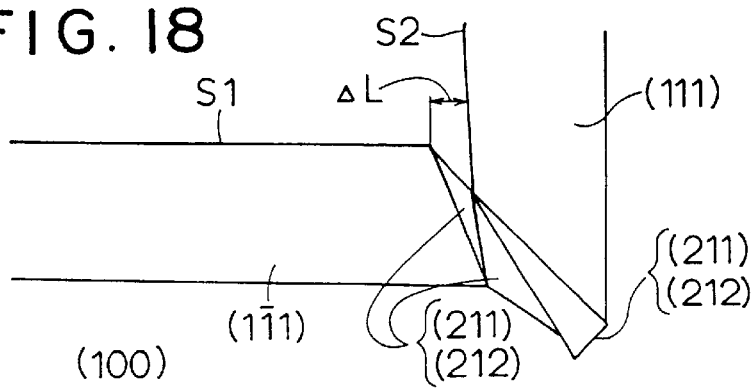
Figure 19:
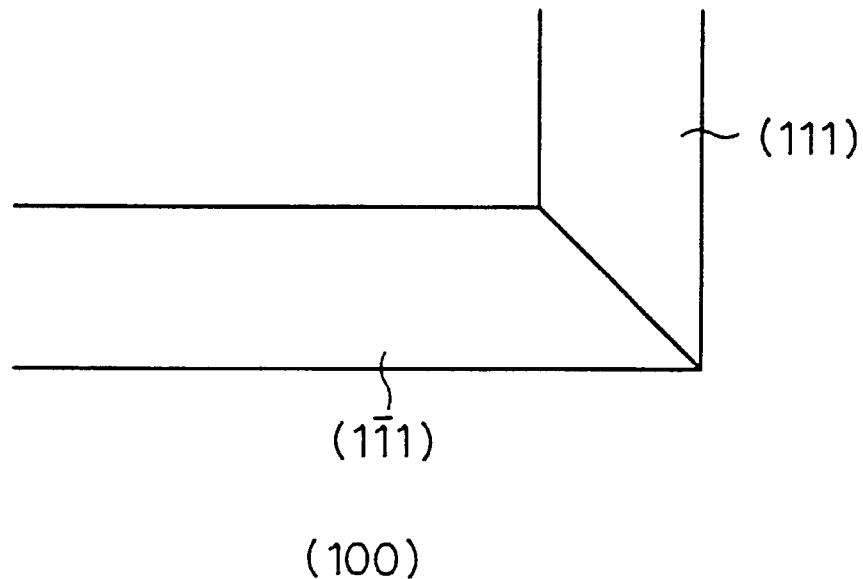
Figure 20:
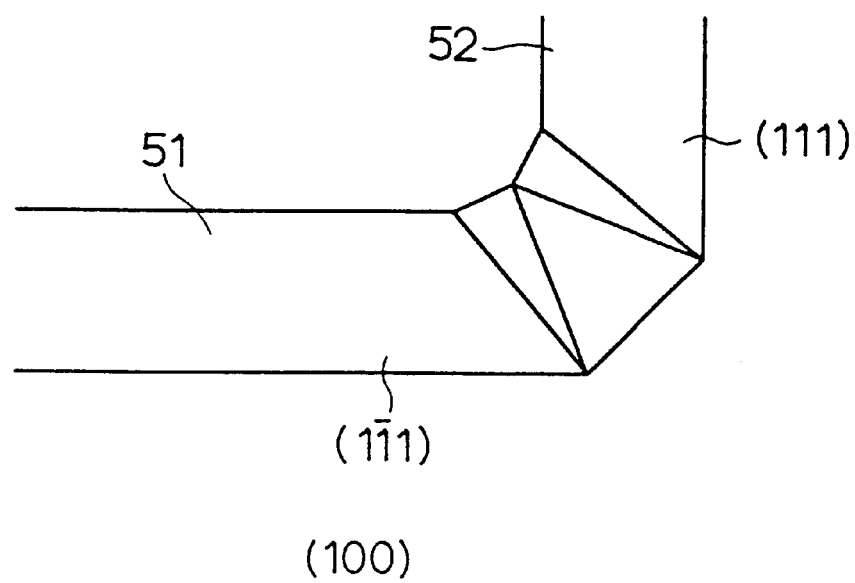

On the other hand, because the etching rate of the (211) and the (212) planes is fast, silicon wafer portions under the form-compensation portions 28a, 28b, 28c, and 28d become surrounded only by the (211), the (2$\bar{1}$1), the (212), and the (2$\bar{1}$2) planes as shown in FIG. 17, and then are eliminated as shown in FIG. 19 through a state shown in FIG. 18. Thereafter, because of the difference of the etching rates, the silicon wafer portion under the mask is etched from the corners to form corner-undercut portions as shown in FIG. 20.

In the embodiment, an etching depth is several hundreds $\mu$m, so that the (100) plane of the silicon wafer is etched at several hundreds $\mu$m, whereas the (111) plane of the silicon wafer is etched only several $\mu$m.

In the etching process, the etching depth (an amount of etching) is directly proportional to etching time. The etching time is determined by a thickness of the beams 8 through 11. For example, when the (100) silicon wafer is etched to form the beams with a predetermined thickness, the etching time is expressed by:

(thickness of silicon wafer–thickness of beam)/(etching rate of (100) plane of silicon wafer).

As shown in FIG. 2, because a sloped wall of the weight 7 exposes the (111) plane, an angle between the sloped wall of the weight 7 and the (100) plane of the silicon wafer is 54.7 degrees. The width $L_w$ of the weight is determined from the mass of the weight and the length $L_b$ of the beams.

Next, the effects of the etching mask in the embodiment will be explained in detail below, compared to a conventional mask with square form-compensation portions.

Figure 25:
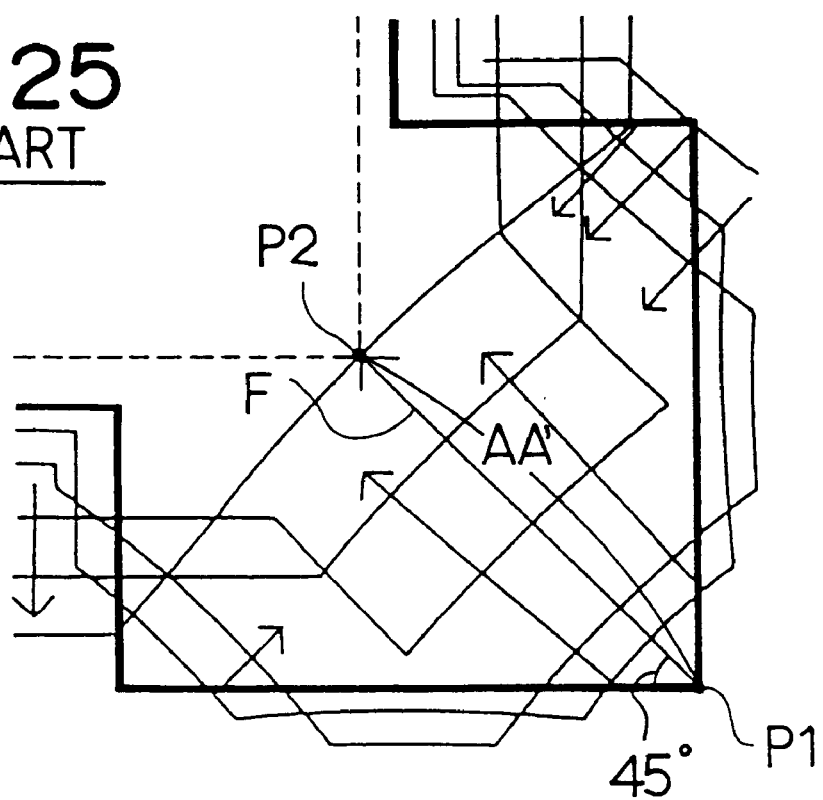
FIG. 25 is a schematic view for explaining a progress of an etching process using an etching mask according to a prior art.
Figure 26:
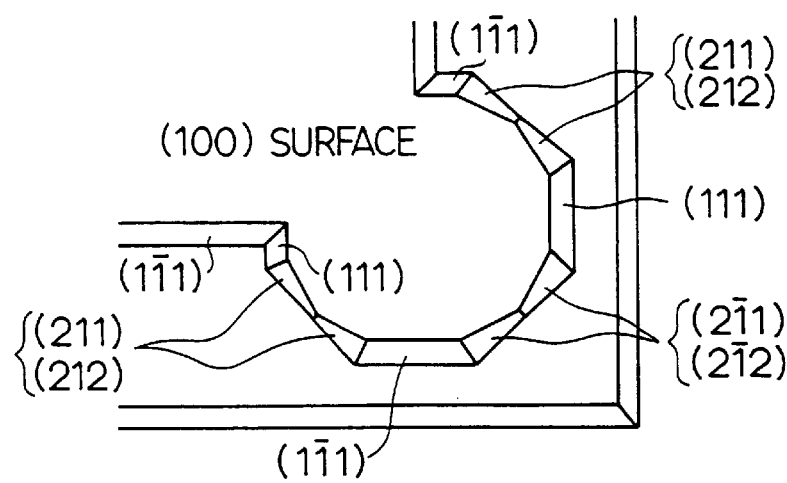
FIGS. 26 through 29 are plan views partly showing states of the silicon wafer under the etching mask according to a prior art.
Figure 27:
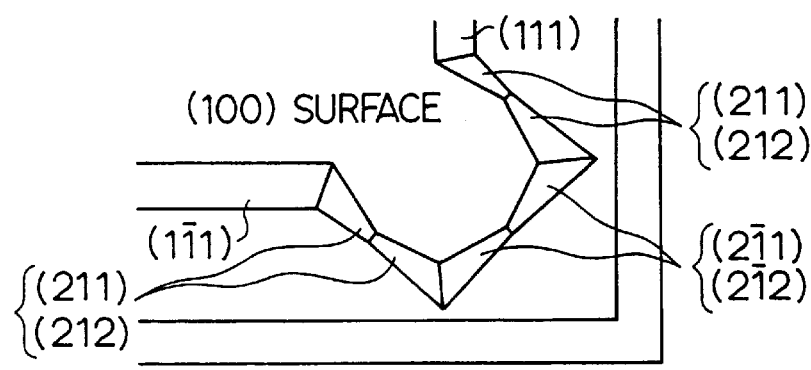

When the conventional etching mask having square form-compensation portions is employed, as shown in FIG. 25, each of the. silicon wafer portions under the square form-compensation portions is etched in a direction F from a corner point P1 of the square form-compensation portion to a corner point P2 of the weight. The direction F makes an angle of 45 degrees to the sides of the form-compensation portions. Dotted lines in FIG. 25 show the sides of the weight after etching. A length AA' between the points P1 and P2 is determined on the basis of the etching time calculated from the etching depth. Each direction indicated by arrows shows an etching direction, and each length of the arrows shows an etching speed.

Figure 28:
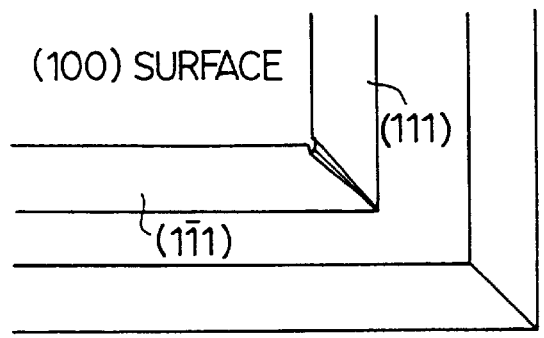
Figure 29:
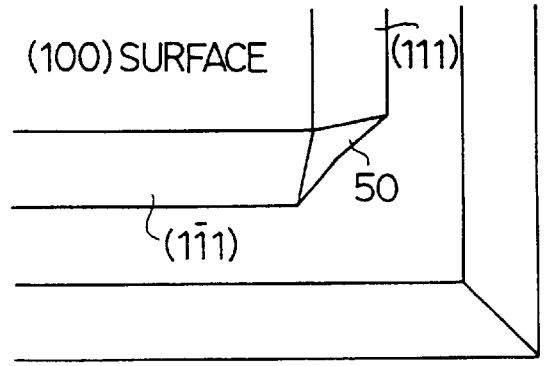
Figure 30:
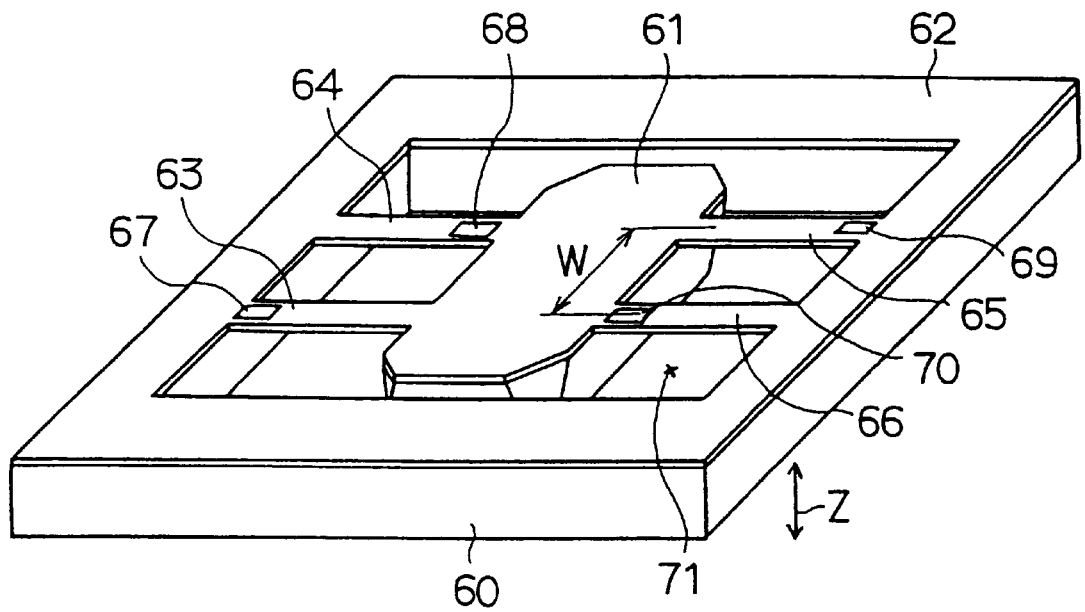
FIG. 30 is a plan view showing an acceleration sensor according to a prior art.
Figure 31:
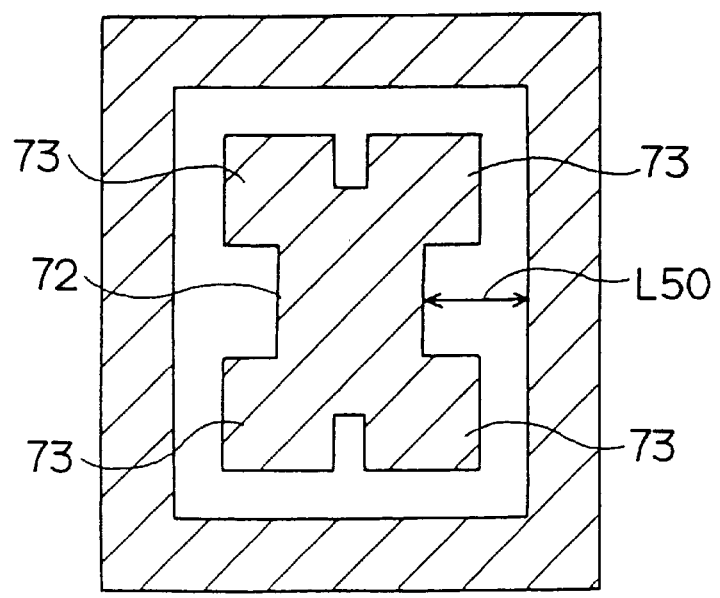
FIG. 31 is a plan view showing an etching mask according to a prior art.
Figure 32:
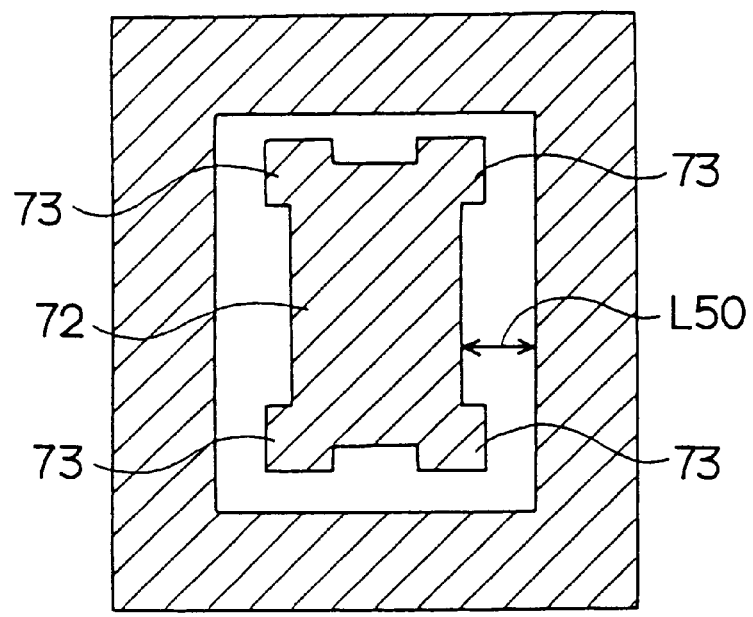
FIG. 32 is a plan view showing an etching mask according to a prior art.
Figure 33:
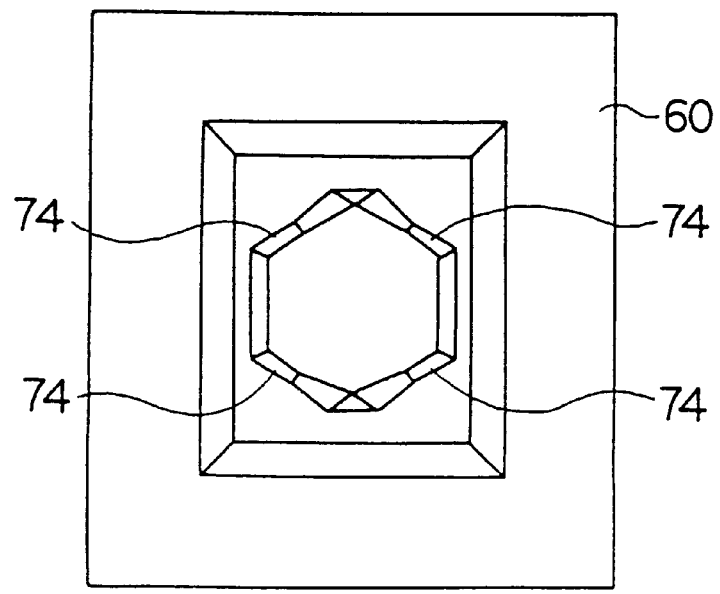
FIG. 33 is a plan view showing a silicon wafer after an etching process using the etching mask in FIG. 32.

As the etching process progresses, the silicon wafer portions under the square form-compensation portions change as shown in FIGS. 26 to 29. After the silicon wafer portion is etched approximately to the point P2 as shown in FIG. 28, corner-undercut portions 50 are formed until the required etching depth can be attained as shown in FIG. 29.

As opposed to this, the pattern of rectangular form-compensation portions in the embodiment is determined in the following way in order to minimize the size of the corner-undercut portions.

Figure 21:
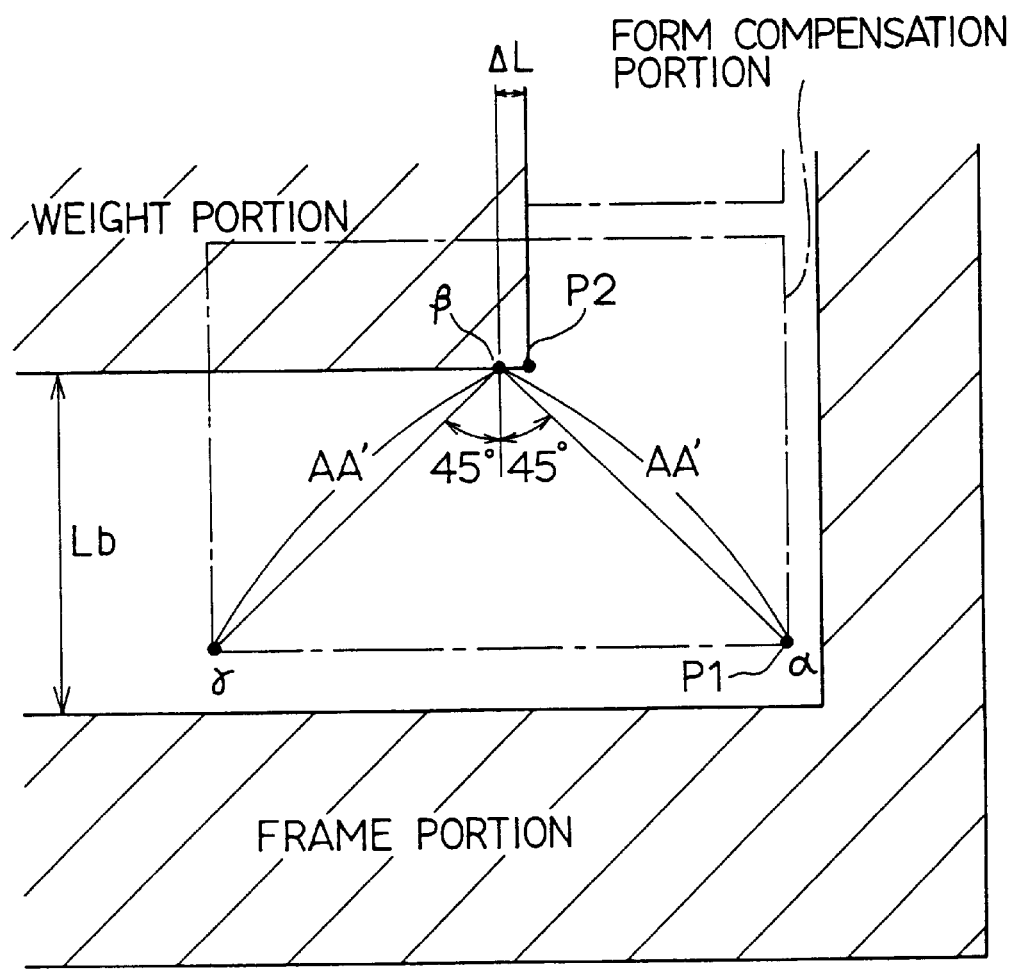
FIG. 21 is a schematic view for explaining the shape of the anisotropic etching mask.

First, as shown in FIG. 21, a point β is found on a side of the weight portion at an end of a line segment αβ, the other end of which is the point P1 (α). The line segment αβ is drawn to make an angle of 45 degrees to a perpendicular line to the side of the weight portion with the predetermined length AA'. The space between the weight and the frame is determined on the basis of the length of the beams (beam length) $L_b$. The length AA' is determined on the basis of the etching time and the etching depth. Next, a parallel line is drawn through the point P1 in parallel to the side of the weight portion. A point γ is afound on the parallel line at an end of a line segment βγ, the other end of which is the point β. The line segment βγ is also drawn to make an angle of 45 degrees to the perpendicular line with the length AA'. The point γ gives another corner point of the rectangular form-compensation portion, whereby the pattern of the etching mask with the form-compensation portions shown in FIG. 12 can be decided.

By determining the pattern of the etching mask in the above mentioned manner, each of the form-compensation portions has the gap ΔL which is the length between the points P2 and β as well as the required length AA'. The gap ΔL functions to prevent the large corner-undercut portion. In the conventional etching mask, the gap ΔL is zero.

More in detail, in the etching process shown in FIGS. 17 and 18, the gap ΔL corresponds to a length between edge portions P10 and P20 and becomes small as the etching process progresses. The edge portion P10 is an intersection point between a side S1 of the weight and a side of the form-compensation portion on the way of the etching, and the edge portion P20 is an intersection point between a side S2 of the weight and an extended line of the side S1.

In the embodiment, until the gap ΔL becomes zero, the corner-undercut portions are not formed. That is, the gap ΔL delays forming the corner-undercut portions, whereby the corner-undercut portions are prevented from becoming large.

Further, even if the space between the weight and the frame is small to make the sensor size small, the required length AA' based on the etching time and the etching depth can be attained by changing the gap ΔL. As a result, it is possible to make the sensor size small without forming the large corner-undercut portions.

Further, because the corner-undercut portions indicated by a broken line 47, are small, the width W between the neighboring beams becomes wide and the weight becomes large. As a result, directivity and sensitivity of the sensor are improved.

Figure 22:
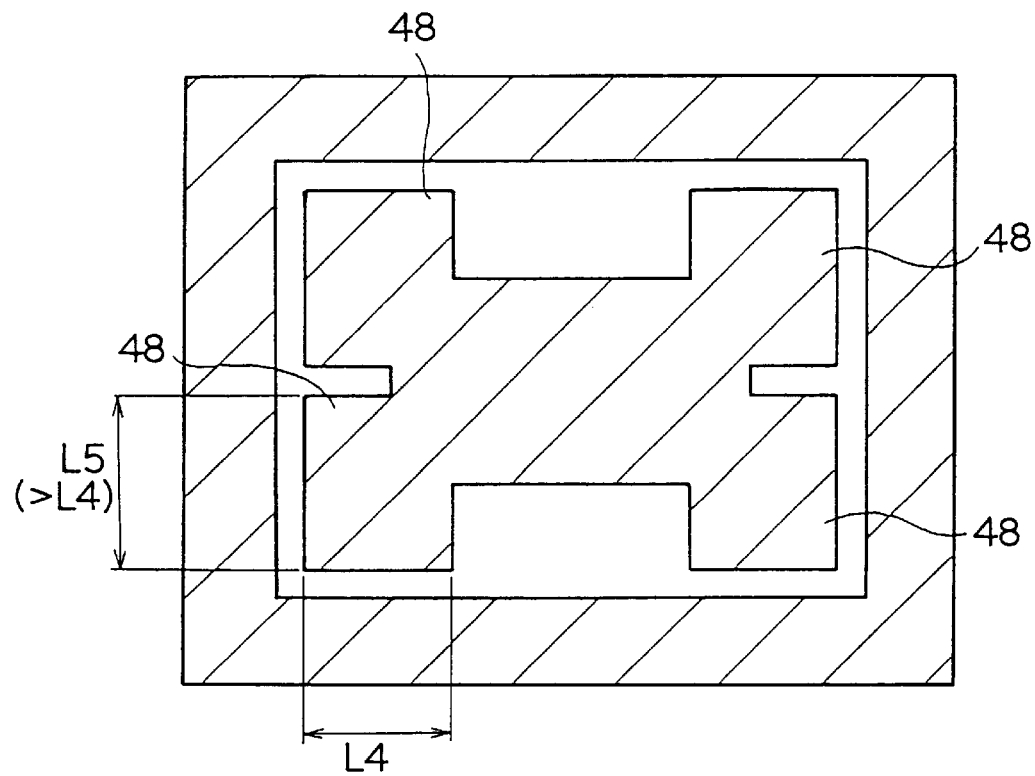
FIG. 22 is a plan view showing a modified anisotropic etching mask according to the present invention.
Figure 23:
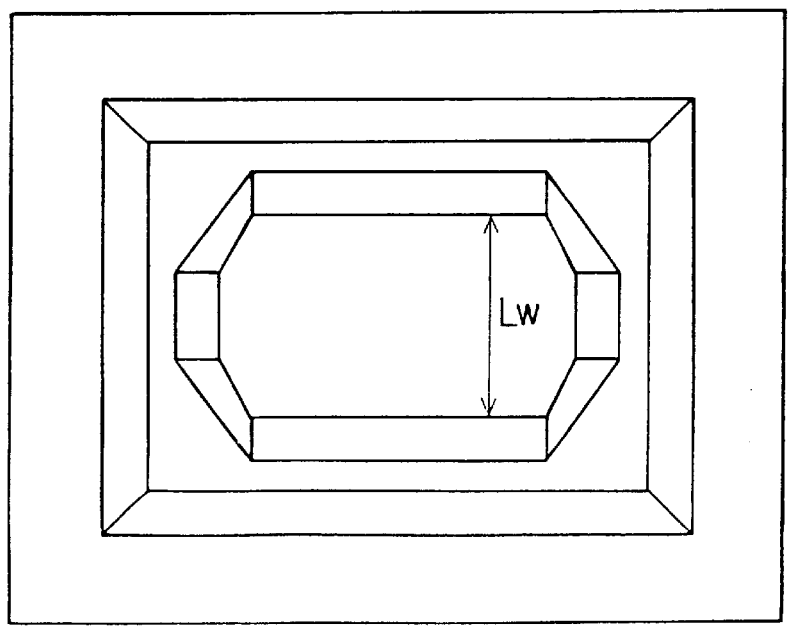
FIG. 23 is a plan view showing a silicon wafer after an etching process with the modified anisotropic etching mask.

In the embodiment, the weight 7 has an elongated shape with the width $L_w$ as shown in FIG. 4, and each form-compensation portion of the mask has the long side in a direction in parallel to the elongated direction of the weight so that the adjacent form-compensation portions do not overlap each other as shown in FIG. 12. However, when the width $L_w$ the weight is sufficiently large, a mask 48 shown in FIG. 22 may be used. The mask 48 has rectangular form-compensation portions with a long side L5 stretching in the direction of the width $L_w$ of the weight and a short side L4 stretching in the elongated direction of the weight 7 so that the adjacent form-compensation portions do not overlap each other. By employing the mask 48, a weight with the wide width $L_w$ can be made as shown in FIG. 23.

The present invention can be applied to semiconductor dynamic sensors such as a semiconductor pressure sensor and the like in addition to the semiconductor acceleration sensor.

Figure 24A:
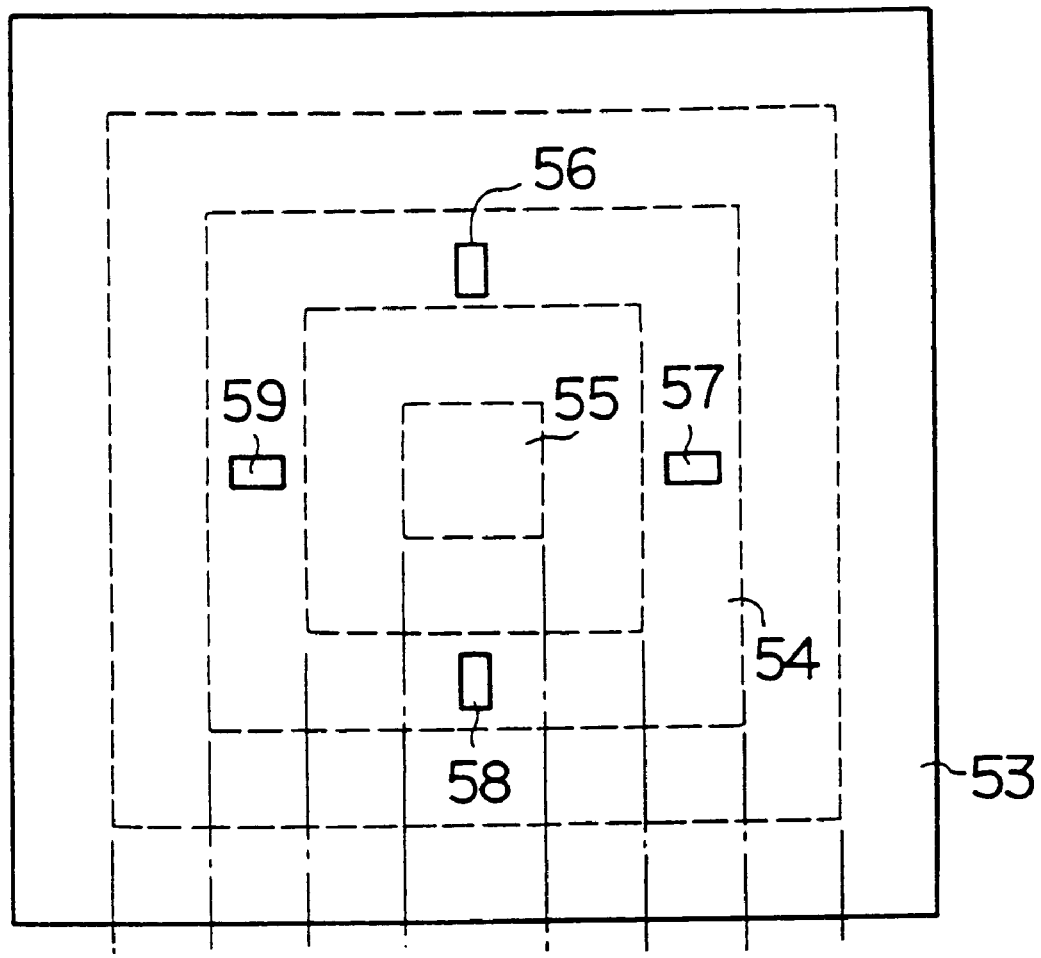
FIGS. 24A and 24B are schematic view showing a semiconductor pressure sensor.
Figure 24B:
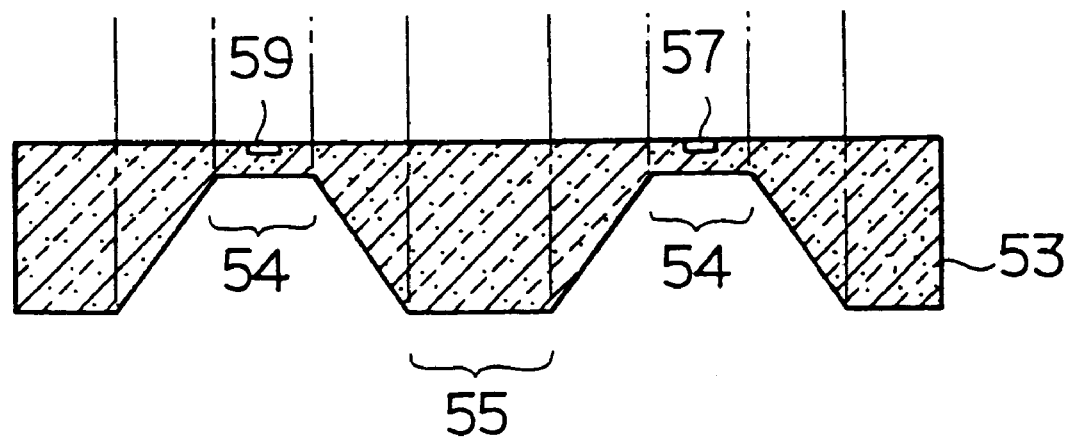

FIGS. 24A and 24B show a semiconductor pressure sensor. The pressure sensor has a (100) crystal orientation silicon substrate 53. The silicon substrate 53 has a thick weight portion 55 at the center thereof and a thin diaphragm portion 54 at the periphery of the weight portions 55. On the diaphragm portion 54, strain gauges 56, 57, 58, and 59 (impurity diffusion layer regions: piezoresistance areas) are formed to detect pressure applied on the sensor with high sensitivity. When the thin diaphragm portion 54 is formed on the silicon substrate 53 by the anisotropic etching method, the etching mask with rectangular form-compensation portions according to the present invention can be used.

The strain gauges may be a resistive element made of a CrSi thin film in place of the diffusion resistive element.

The etching solution may be a HDMS or the like. Further, the etching method is not limited to the electrochemical etching method, and is acceptable to be an wet etching method.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A composite structure comprising:

a {100} crystal orientation silicon substrate; and a mask member disposed on the silicon substrate for preventing a predetermined area of the silicon substrate from being etched in an anisotropic etching process by entirely covering the predetermined area, the mask member comprising:

a main portion having approximately the same shape as that of the predetermined area of the silicon substrate and having a corner having a right angle, the corner being defined by a first main portion side and a second main portion side; and a form-compensation portion formed at the corner of the main portion and having a generally rectangular shape with a first form-compensation side, a second form-compensation side longer than the first form-compensation side and perpendicular to the first form-compensation side, and third and fourth form-compensation sides respectively parallel to each of the first and second form-compensation sides and respectively passing through each of the first and second main portion sides;

wherein one of the first and second form-compensation portion sides is parallel to a <011> direction of the silicon substrate.

2. A composite structure according to claim 1, wherein:

the first main portion side is longer than the second main portion side; and the second form-compensation side is parallel to the first main portion side.

3. A composite structure according to claim 1, further comprising a frame, wherein the main portion is disposed within the frame to make a specific space with the frame; and the form-compensation portion is disposed within the space.

4. A composite structure according to claim 1, wherein said mask member has a first axis bisecting said mask member and a second axis bisecting said mask member, said first axis and said second axis being perpendicular to each other, and said mask member being symmetrical about both said first axis and said second axis.

5. A composite structure according to claim 1, wherein the mask member is directly disposed on the silicon substrate.

6. A composite structure according to claim 5, wherein the mask member is made of a nitrogen compound.

7. A composite structure according to claim 1, wherein a dimension of the form-compensation portion is designated to retard under etching from the corner of the main portion.

8. A composite structure according to claim 1, wherein the form-compensation portion has five corners.

9. A mask member, comprising:
a main portion having approximately the same shape as a plan shape of a structure consequent upon an anisotropic etching process performed on a silicon substrate and having a plurality of right-angled corners, each of the right-angled corners defined by a first main portion side and a second main portion side; and
a plurality of form-compensation portions each formed at a corresponding one of the right-angled corners of the main portion and having a generally rectangular shape with a first form-compensation side, a second form-compensation side longer than the first form-compensation side and perpendicular to the first form-compensation side, and third and fourth form-compensation sides respectively parallel to the first and second form-compensation sides and respectively passing through the first and second main portion sides;
wherein each of the plurality of the right-angled corners of the main portion has a corresponding one of the plurality of the form-compensation portions formed thereon.

10. A mask member according to claim 9, wherein:
the silicon substrate has a {100} crystal orientation; and
one of the first and second main portion sides is parallel to a <011> direction of the silicon substrate.

11. A mask member according to claim 9, further comprising a frame, wherein the main portion is disposed within the frame with a specific gap between the first main portion side and the frame.

12. A mask member according to claim 9, wherein the mask member is composed of a glass substrate and a chromium thin film provided on the glass substrate and including the main portion and the plurality of form-compensation portions.

13. A mask member according to claim 9, wherein a first one of the plurality of form-compensation portions is separated from an adjacent second one of the plurality of form-compensation portions with a side of the main portion connecting the first one and the second one of the plurality of form-compensation portions.

14. A mask member according to claim 9, wherein the mask member is disposed on the silicon substrate directly as an anisotropic etching mask.

15. A mask member according to claim 9, wherein each of the plurality of form-compensation portions has five corners.

16. A mask member, comprising:
a main portion having approximately the same shape as a plan shape of a structure consequent upon an anisotropic etching process performed on a silicon substrate, and having a corner having a right angle, the corner being defined by a first main portion side and a second main portion side; and
a form-compensation portion formed at the corner of the main portion and having a generally rectangular shape with a first form-compensation side, a second form-compensation side longer than the first form-compensation side and perpendicular to the first form-compensation side, and third and fourth form-compensation sides respectively parallel to each of the first and second form-compensation sides and respectively perpendicular to each of the first and second main portion sides;
wherein the mask member has a first axis bisecting the mask member and a second axis bisecting the mask member, the first axis and the second axis being perpendicular to each other, and the mask member being symmetrical about both the first axis and the second axis.

17. A mask member according to claim 16, wherein the form-compensation portion overlaps with the main portion with the third and fourth form-compensation sides respectively passing through each of the first and second main portion sides.

18. A mask member according to claim 16, wherein,
the first main portion side is longer than the second main portion side; and
the second form-compensation side is parallel to the first main portion side.

19. A mask member according to claim 16, further comprising a frame.

20. A mask member according to claim 19, wherein the main portion is disposed within the frame with a specific gap between the first main portion side and the frame.

21. A mask member according to claim 20, wherein the specific distance between the second main portion side and the point collinear with the first main portion side and equidistant from the end points of the one of the first and second form-compensation sides is determined based on the specific gap between the first main portion side and the frame.

22. A mask member according to claim 20, wherein a length between the end points of the one of the first and second form-compensation sides and the point collinear with the first main portion side and equidistant from the end points is determined based on the specific gap between the first main portion side and the frame.

23. A mask member according to claim 19, wherein the main portion is disposed within the frame to make a space with the frame, and the form-compensation portion is disposed within the space.

24. A mask member according to claim 23, wherein a length between the end points of the one of the first and second form-compensation sides and the point collinear with the first main portion side and equidistant from the end points is determined based on a size of the space between the main portion and the frame.

25. A mask member according to claim 16, wherein said mask member has a first axis bisecting said mask member and a second axis bisecting said mask member, said first axis and said second axis being perpendicular to each other, and said mask member being symmetrical about both said first axis and said second axis.

26. A mask member according to claim 16, wherein the mask member is composed of a glass substrate and a chromium thin film provided on the glass substrate and including the main portion and the form-compensation portion.

27. A mask member according to claim 16, wherein the mask member is disposed on the silicon substrate directly as an anisotropic etching mask.

28. A mask member according to claim 16, wherein:
one of the first and second form-compensation sides is parallel to the first main portion side; and
end points of said one of the first and second form-compensation sides are equidistant from a point collinear with the first main portion side, the point defining a specific distance from the second main portion side.

29. A mask member according to claim 28, wherein:
said one of the first and second form-compensation sides parallel to the first main portion side makes a right isosceles triangle with the point collinear with the first main portion side, while defining a hypotenuse of the right isosceles triangle.

30. A mask member, comprising:
a main portion for forming an anisotropic etching mask on a silicon substrate, having approximately the same shape as a plan shape of a structure consequent upon an anisotropic etching process performed on the silicon substrate through the anisotropic etching mask, and having corners each having a right angle and a first main portion side and a second main portion side, said first main portion side being longer than said second main portion side; and
form-compensation portions formed at each of the corners of the main portion to protrude from the main portion and having a general rectangular shape with a first form-compensation side, a second form-compensation side longer than the first form-compensation side and perpendicular to the first form-compensation side, and third and fourth form-compensation sides respectively parallel to each of the first and second form-compensation sides and respectively perpendicular to each of the first and second main portion sides;
wherein each of said second form-compensation sides of said form-compensation portions are parallel with said first main portion side of said main portion.

31. A mask member according to claim 30, wherein:
end points of said one of the first and second form-compensation sides are equidistant from a point collinear with the first main portion side, the point defining a specific distance from the second main portion side; and
one of the first and second form-compensation sides is parallel to a <011> direction of the silicon substrate.

32. A mask member according to claim 31, wherein:
said one of the first and second form-compensation sides parallel to the first main portion side makes a right isosceles triangle with the point collinear with the first main portion side, while defining a hypotenuse of the right isosceles triangle.

33. A mask member according to claim 30, wherein the mask member is composed of a glass substrate and a chromium thin film provided on the glass substrate and including the main portion and the form-compensation portion.

34. A mask member having a mask pattern which comprises:
a main masking portion having approximately the same shape as a plan shape of a structure consequent upon an anisotropic etching performed on a {100}-oriented silicon for entirely covering the plan shape of the structure; and
a plurality of form-compensation masking portions respectively disposed to overlap with a plurality of right-angled corners of said main masking portion, the right-angled corners being formed by corresponding sides aligned along <011>-directions of said {100}-oriented silicon; wherein:
each of said form-compensation masking portions has a generally rectangular shape with a first side and a second side longer than said first side and a size, designed in association with an amount of said anisotropic etching of said {100}-oriented silicon, sufficient to retard an occurrence of collision between {111} etched surfaces of said structure during said anisotropic etching, said first side and said second side extending along <011>-direction of said {100}-oriented silicon; and
each of the plurality of form-compensation masking portions is separated from an adjacent one of the plurality of form-compensation masking portions by a side of the main portion interposed therebetween.

35. A mask member according to claim 34, wherein the masking pattern is made of a nitrogen compound.

36. A mask member according to claim 34, wherein the masking pattern is provided on a glass substrate.

37. A mask member according to claim 36, wherein the masking pattern is made of chromium.

38. A mask member according to claim 34, wherein said amount of the anisotropic etching is a target etch depth of the structure.

39. A mask member according to claim 34, wherein each of the plurality of right-angled corners has a corresponding one of the plurality of form-compensation masking portions formed thereon.

* * * * *